United States Patent
Nakanishi et al.

(10) Patent No.: US 11,949,413 B2
(45) Date of Patent: Apr. 2, 2024

(54) SEMICONDUCTOR DEVICE

(71) Applicant: Nuvoton Technology Corporation Japan, Kyoto (JP)

(72) Inventors: Kazuyuki Nakanishi, Osaka (JP); Akio Hirata, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 225 days.

(21) Appl. No.: 17/698,903

(22) Filed: Mar. 18, 2022

(65) Prior Publication Data

US 2022/0209773 A1 Jun. 30, 2022

Related U.S. Application Data (63) Continuation of application No. PCT/JP2020/019307, filed on May 14, 2020.

(30) Foreign Application Priority Data

Sep. 27, 2019 (JP) .................................. 2019-177845

(51) Int. Cl.
*H01L 23/522* (2006.01)
*H01L 27/02* (2006.01)
*H03K 3/3562* (2006.01)
*H03K 19/007* (2006.01)

(52) U.S. Cl.
CPC ....... *H03K 19/0075* (2013.01); *H01L 23/522* (2013.01); *H01L 27/0203* (2013.01); *H03K 3/35625* (2013.01)

(58) Field of Classification Search
None
See application file for complete search history.

(56) References Cited

U.S. PATENT DOCUMENTS

| | | | |
|---|---|---|---|
| 7,920,410 B1 * | 4/2011 | Lee | G11C 8/10 365/72 |
| 8,330,494 B2 | 12/2012 | Uemura | |
| 2005/0104133 A1 * | 5/2005 | Kanno | G01R 31/318572 257/E27.062 |
| 2009/0152595 A1 | 6/2009 | Kaga et al. | |

(Continued)

FOREIGN PATENT DOCUMENTS

| | | |
|---|---|---|
| JP | S63-255941 A | 10/1998 |
| JP | 2001-298087 A | 10/2001 |

(Continued)

OTHER PUBLICATIONS

International Search Report dated Jul. 28, 2020 in International Patent Application No. PCT/JP2020/019307, with English translation.

*Primary Examiner* — Benjamin P Sandvik
(74) *Attorney, Agent, or Firm* — Rimon P.C.

(57) ABSTRACT

A semiconductor device according to an aspect of the present disclosure includes: a plurality of line layers; a first line; and a second line that is not connected to the first line and is redundantly provided to transfer a signal having a level same as a level of a signal transferred through the first line. The first line and the second line are included in different layers out of the plurality of line layers, and a distance between the first line and the second line is longer than an interlayer distance between line layers next to each other out of the plurality of line layers.

12 Claims, 9 Drawing Sheets

(56) References Cited

U.S. PATENT DOCUMENTS

| | | | | |
|---|---|---|---|---|
| 2010/0084689 A1* | 4/2010 | Nakamura | .......... | H01L 27/0207 |
| | | | | 257/206 |
| 2010/0225356 A1 | 9/2010 | Uemura et al. | | |
| 2017/0186483 A1* | 6/2017 | Singh | .................... | H01L 23/528 |
| 2018/0130518 A1* | 5/2018 | Ko | ........................ | H01L 23/528 |
| 2018/0174959 A1* | 6/2018 | Kim | .................... | G11C 11/4097 |

FOREIGN PATENT DOCUMENTS

| JP | 2007-103598 A | 4/2007 |
|---|---|---|
| JP | 2010-092963 A | 4/2010 |
| JP | 5369771 B2 | 12/2013 |
| JP | 2018-107626 A | 7/2018 |

* cited by examiner

SEMICONDUCTOR DEVICE

CROSS REFERENCE TO RELATED APPLICATIONS

This is a continuation application of PCT International Application No. PCT/JP2020/019307 filed on May 14, 2020, designating the United States of America, which is based on and claims priority of Japanese Patent Application No. 2019-177845 filed on Sep. 27, 2019. The entire disclosures of the above-identified applications, including the specifications, drawings and claims are incorporated herein by reference in their entirety.

FIELD

The present disclosure relates to a semiconductor device that includes a latch circuit.

BACKGROUND

In semiconductor devices, soft errors in latch circuits (also referred to as flip-flop circuits) in logic circuits have been problems. A soft error refers to a temporary error of inverting the state of a latch circuit by noise entering due to collision of particle rays such as cosmic rays against the latch circuit.

As an example of a circuit that is highly resistant to soft errors, a latch circuit illustrated in FIG. 2 of Patent Literature (PTL) 1 includes four inverter circuits, and has a dual-redundant circuit configuration. The same data is input to the gates of a PMOS transistor and an NMOS transistor of each inverter circuit, but the gates are connected to different nodes. Even if noise that may cause a soft error enters one of the four nodes, the state of the latch circuit can be restored based on the other nodes.

PTL 2 discloses a semiconductor device that includes, with regard to an inspection method for detecting an electrical failure in a large scale integrated circuit (LSI) with high sensitivity for a short inspection time, a basic line pattern that includes a squared U-shaped first line having a pair of parallel comb-shaped conductors, and a squared U-shaped second line having a pair of parallel comb-shaped conductors disposed such that the conductors of the second line are alternately arranged with the conductors of the first line.

CITATION LIST

Patent Literature

PTL 1: Japanese Patent No. 5369771
PTL 2: Japanese Unexamined Patent Application Publication No. 2007-103598

SUMMARY

Technical Problem

However, the above conventional technique has a problem that if a redundant line pair having the same signal level short-circuit, although soft error resistance has deteriorated, that short circuit cannot be detected at an inspection stage.

The present disclosure provides a semiconductor device that reduces deterioration in soft error resistance caused by a short circuit of a redundant line pair.

Solution to Problem

A semiconductor device according to an aspect of the present disclosure includes: a plurality of line layers; a first line; and a second line that is not connected to the first line and is provided to transfer a signal having a level same as a level of a signal transferred through the first line. The first line and the second line are included in different layers out of the plurality of line layers, and a distance between the first line and the second line is longer than an interlayer distance between line layers next to each other out of the plurality of line layers.

Advantageous Effects

According to a semiconductor device according to the present disclosure, deterioration in soft error resistance caused by a short circuit of a redundant line pair can be reduced.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS (Underlying Knowledge Forming Basis of the Present Disclosure)

The present inventors have found that problems as follows occur in a highly soft error resistant circuit stated in the "Background" section. The problems are to be specifically described with reference to FIG. 14.

Figure 14:
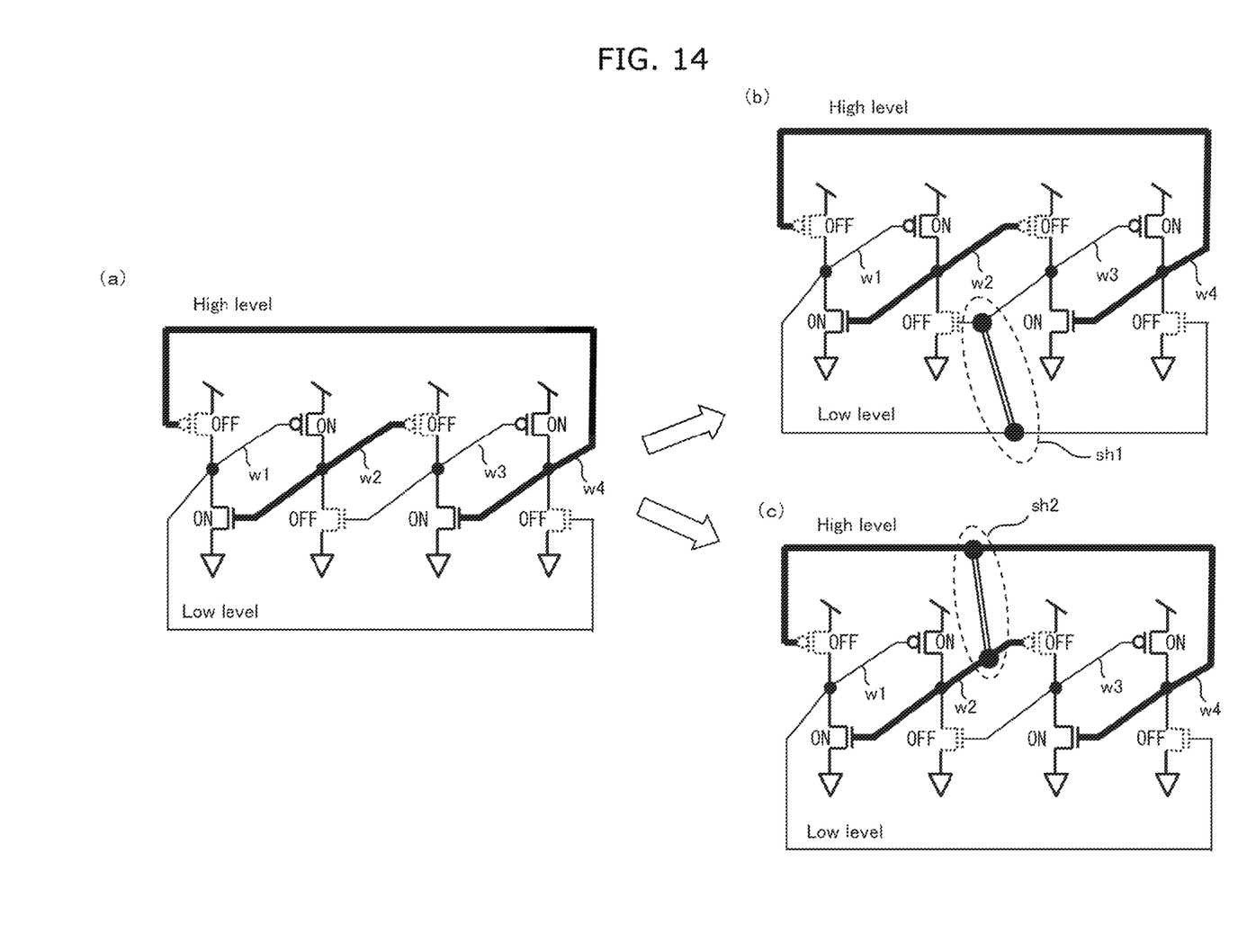
FIG. 14 illustrates explanatory drawings showing examples of short circuits of a latch circuit in a comparative example.

FIG. 14 is an explanatory drawing showing examples of short circuits of a latch circuit in a comparative example. A latch circuit illustrated in (a) of FIG. 14 includes four PMOS transistors and four NMOS transistors. A pair formed by a PMOS transistor and an NMOS transistor connected in series are included in an inverter circuit.

A normal latch circuit includes two inverter circuits, whereas the latch circuit illustrated in (a) of FIG. 14 includes four inverter circuits. The latch circuit illustrated in (a) of FIG. 14 improves soft error resistance by having a dual-redundant configuration.

In (a) of FIG. 14, the four inverter circuits are connected by four lines w1 to w4. Line w1 and line w3 form a redundant line pair, and have the same signal level, but are independent lines. Similarly, line w2 and line w4 form a redundant line pair, and have the same signal level, but are independent lines.

FIG. 14 illustrates line w1 and line w3 that form a redundant line pair with narrow lines, and shows an example in which the lines have a low level. Furthermore, FIG. 14 illustrates line w2 and line w4 that form another redundant line pair with thick lines, and shows an example in which the lines have a high level.

Signals having the same level are input to the gates of a PMOS transistor and an NMOS transistor in each inverter circuit, but the gates are connected to different lines. Thus, one line of a redundant line pair is connected to the gate of a PMOS transistor. The other line of the redundant line pair is connected to the gate of an NMOS transistor. In this manner, the four inverter circuits form loops, which acquires a configuration in which even if output of one inverter circuit is inverted, a correct value is maintained by the other three inverter circuits. Accordingly, the latch circuit in (a) of FIG. 14 increases soft error resistance.

Part (b) of FIG. 14 illustrates that line w1 and line w3 short-circuit as shown by broken-line frame sh1. Part (c) of FIG. 14 illustrates that line w2 and line w4 short-circuit as shown by broken-line frame sh2. In the process of manufacturing a semiconductor device that includes a latch circuit, such a short circuit may occur due to, for example, a conductive foreign substance such as metal particles being mixed into.

In each of (b) and (c) of FIG. 14, a redundant line pair short-circuit. Thus, the line pair that have short-circuited as shown by each of broken-line frames sh1 and sh2 are independent lines not connected to each other, but always have the same signal level when the latch circuit operates. For this reason, the latch circuit normally operates and indicates no anomaly in both (b) and (c) of FIG. 14. However, a problem arises that soft error resistance deteriorates since redundancy of the line pair is lost due to the short circuit.

Furthermore, short circuits shown by broken-line frames sh1 and sh2 cannot be detected in an inspection stage in the process of manufacturing a semiconductor device. Thus, there is a problem that deterioration in soft error resistance caused by short circuits shown by broken-line frames sh1 and sh2 cannot be detected.

In view of this, the present disclosure provides a semiconductor device that reduces deterioration in soft error resistance caused by a short circuit of a redundant line pair.

In order to address such a problem, a semiconductor device according to an aspect of the present disclosure includes: a plurality of line layers; a first line; and a second line that is not connected to the first line and is provided to transfer a signal having a level same as a level of a signal transferred through the first line. The first line and the second line are included in different layers out of the plurality of line layers, and a distance between the first line and the second line is longer than an interlayer distance between line layers next to each other out of the plurality of line layers.

According to this, deterioration in soft error resistance caused by a short circuit of a redundant line pair can be reduced. That is because if a foreign substance having approximately the same size as a distance between lines is mixed into, a short circuit between another line and the first line or the second line is more likely to occur than a short circuit between the first line and the second line. As a result, an undetectable short circuit can be prevented from occurring, or stated differently, a redundant line pair can be prevented from short-circuiting.

If the first line or the second line and the other line short-circuit due to a foreign substance being mixed into, a probability that an abnormal operation is caused is high, and thus a short circuit can be detected in the inspection stage before factory shipment.

Thus, deterioration in soft error resistance caused by a short circuit of a redundant line pair can be reduced.

The following specifically describes embodiments with reference to the drawings.

Note that the embodiments described below each show a general or specific example. The numerical values, shapes, materials, elements, the arrangement and connection of the elements, steps, and the order of processing the steps, for instance, described in the following embodiments are examples, and thus are not intended to limit the present disclosure. Among the elements in the following embodiments, elements not recited in the independent claim defining an embodiment according to an aspect of the present disclosure are described as optional elements. The embodiments of the present disclosure are not limited to the current independent claim, but may be expressed by another independent claim.

Embodiment 1

[1 Example of Circuit of Semiconductor Device]

Figure 1:
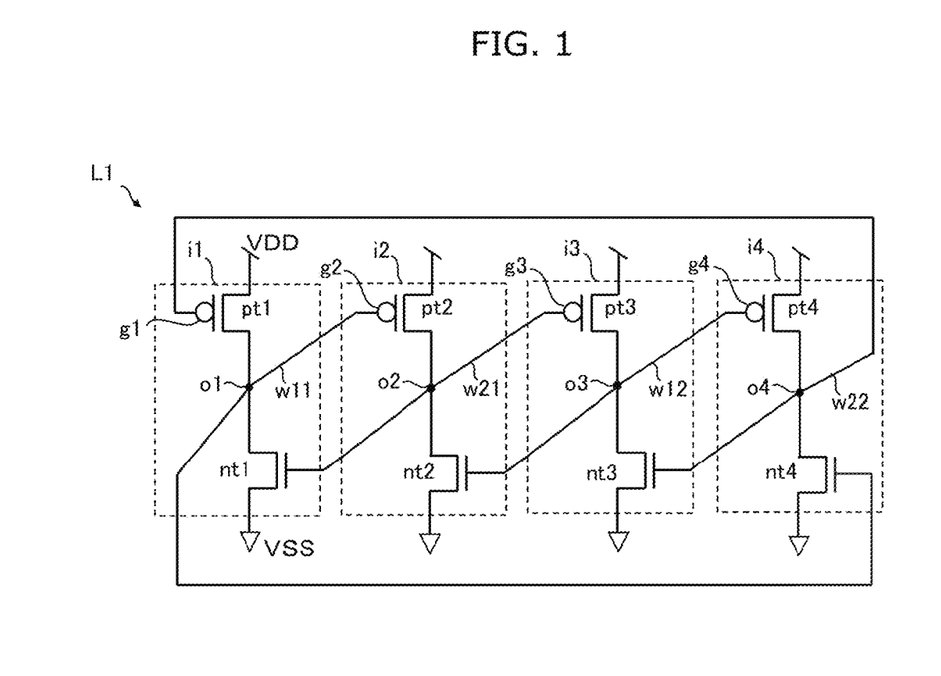
FIG. 1 illustrates an example of a circuit formed in a semiconductor device according to Embodiment 1.

FIG. 1 illustrates an example of a circuit formed in a semiconductor device according to Embodiment 1.

The example of the circuit in FIG. 1 includes latch circuit L1 that includes first to fourth inverting circuits i1 to i4. First to fourth inverting circuits i1 to i4 include four first-type MOS transistors pt1 to pt4 and four second-type MOS transistors nt1 to nt4. Latch circuit L1 shows a so-called dual interlocked storage cell (DICE) latch circuit as an example of a circuit that includes a redundant line pair.

First inverting circuit i1 includes first-type MOS transistor pt1, second-type MOS transistor nt1, and output node o1 connected to the drain of first-type MOS transistor pt1 and the drain of second-type MOS transistor nt1.

Second inverting circuit i2 includes first-type MOS transistor pt2, second-type MOS transistor nt2, and output node o2 connected to the drain of first-type MOS transistor pt2 and the drain of second-type MOS transistor nt2.

Third inverting circuit i3 includes first-type MOS transistor pt3, second-type MOS transistor nt3, and output node o3 connected to the drain of first-type MOS transistor pt3 and the drain of second-type MOS transistor nt3.

Fourth inverting circuit i4 includes first-type MOS transistor pt4, second-type MOS transistor nt4, and output node o4 connected to the drain of first-type MOS transistor pt4 and the drain of second-type MOS transistor nt4.

The sources of the first-type MOS transistors of first to fourth inverting circuits i1 to i4 are connected to power lines having potential VDD, and the sources of the second-type MOS transistors thereof are connected to the ground (GND) lines having potential VSS.

Note that the first type means one of the conductivity types, P type and N type. The second type means the other of the conductivity types, P type and N type. In the example in FIG. 1, the first type is P type and the second type is N type. In the following, the first type may be expressed as P, and the second type may be expressed as N. In addition, the first-type MOS transistor may be expressed as a PMOS transistor, and the second-type MOS transistor may be expressed as an NMOS transistor.

The first to fourth inverting circuits are connected by four lines w11, w12, w21, and w22. Line w11 and line w12 form a redundant line pair, and have the same signal level, but are independent lines that are not connected to each other. Similarly, line w21 and line w22 form a redundant line pair, and have the same signal level, but are independent lines that are not connected to each other. Note that the lines included in a redundant line pair indicate not only metal line portions in a line layer, but also series of conductors including, for instance, via contacts between line layers, electrodes of gates, sources, and drains of transistors, and terminal electrodes of circuit elements. In the following, a "via contact" may be simply referred to as a "via".

Line w11 connects output node o1 of first inverting circuit i1 to gate g2 of first-type MOS transistor pt2 in second inverting circuit i2 and the gate of second-type MOS transistor nt4 in fourth inverting circuit i4.

Line w21 connects output node o2 of second inverting circuit i2 to gate g3 of first-type MOS transistor pt3 in third inverting circuit i3 and the gate of second-type MOS transistor nt1 in first inverting circuit i1.

Line w12 connects output node o3 of third inverting circuit i3 to gate g4 of first-type MOS transistor pt4 in fourth inverting circuit i4 and the gate of second-type MOS transistor nt2 in second inverting circuit i2.

Line w22 connects output node o4 of fourth inverting circuit i4 to gate g1 of first-type MOS transistor pt1 in first inverting circuit i1 and the gate of second-type MOS transistor nt3 in third inverting circuit i3.

Such connection allows the four inverter circuits to form loops. Accordingly, this acquires a structure in which even if the output of one inverter circuit is inverted due to a soft error, a correct value is maintained by the other three inverter circuits. Accordingly, latch circuit L1 in FIG. 1 increases soft error resistance.

Latch circuit L1 illustrated in FIG. 1 forms a portion of a semiconductor circuit formed on a semiconductor substrate in the semiconductor device. The semiconductor circuit formed on the semiconductor substrate includes, for instance, a plurality of p-type impurity regions, a plurality of n-type impurity regions, a plurality of line layers, and a plurality of contacts that connect the line layers.

The redundant line pairs that are elements of latch circuit L1 in FIG. 1 are formed in one or more line layers. In the present embodiment, a redundant line pair is disposed so as to prevent the redundant line pair from short-circuiting due to, for instance, a foreign substance being mixed into in the process of manufacturing the semiconductor device.

The following describes disposition layouts of redundant line pairs in different line layers.

[2.1 First Example of Line Layout in Line Layers]

Figure 2:
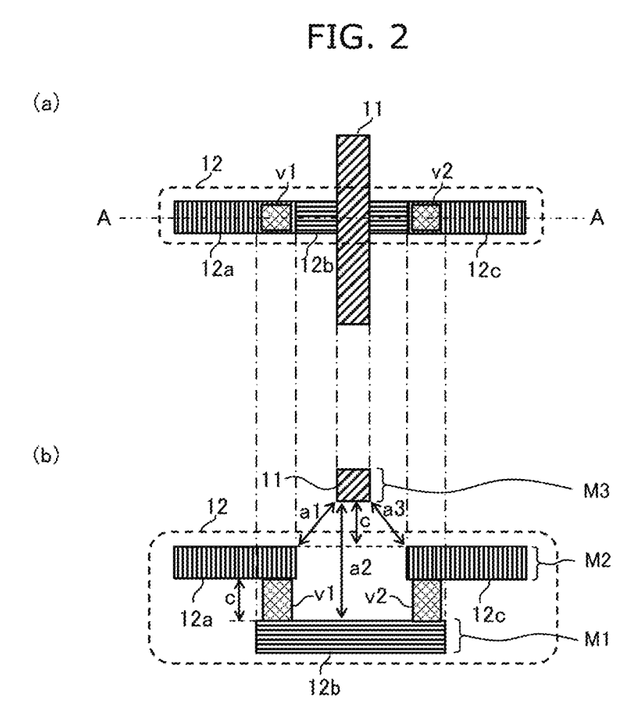
FIG. 2 illustrates a first example of a line layout in line layers.

FIG. 2 illustrates a first example of a line layout in line layers. Part (a) of FIG. 2 illustrates a line layout in a plan view of a semiconductor substrate on which latch circuit L1 is formed. Part (b) of FIG. 2 illustrates a cross section taken along line A-A in (a), and includes three line layers M1 to M3. Part (b) of FIG. 2 is a schematically enlarged view of a portion related to a redundant line pair out of lines formed in line layers M1 to M3. FIG. 2 illustrates line 11 and line 12 that form a redundant line pair.

As illustrated in FIG. 2, line 11 and line 12 that form a redundant line pair are included in different line layers. Thus, line 11 is included in line layer M3, and line 12 is included in line layers M2 and M1 and includes via contacts.

A redundant line pair in different line layers are disposed, satisfying the following relation. Specifically, when different line layers include line 11 and line 12, distance a between line 11 and line 12 is longer than interlayer distance c between line layers next to each other. In FIG. 2, a1, a2, and a3 are denoted as three distances between line 11 and line 12, and distance a between line 11 and line 12 is a1 or a3 that denotes the shortest distance. Line 11 and line 12 are disposed, satisfying a>c.

To provide more detailed description, in FIG. 2, the semiconductor device includes, in a plan view thereof, an overlapping portion in which line 11 and line 12 overlap and cross each other. Line 12 includes first partial line 12b in which the overlapping portion is included, second partial line 12a connected to a first end of first partial line 12b, and third partial line 12c connected to a second end of first partial line 12b. First partial line 12b is included in line layer M1. Second partial line 12a and third partial line 12c are included in line layer M2 different from line layer M1, and connected to first partial line 12b through via contacts v1 and v2, respectively. Line 11 is included in line layer M3 farther from line layer M1 than from line layer M2. This disposition layout readily allows the above relation (that is, a>c) to be satisfied. In FIG. 2, lines 11 and 12 are disposed such that a relation that distance a2 between line 11 and line 12 in the overlapping portion is at least twice interlayer distance c is satisfied.

According to the disposition layout in FIG. 2, deterioration in soft error resistance caused by a short circuit of the redundant line pair can be reduced. That is because if a foreign substance having approximately the same size as interlayer distance c is mixed into, lines 11 and 12 are less likely to short-circuit. Accordingly, a short circuit of the redundant line pair can be prevented from occurring.

Note that line layers M1 to M3 in FIG. 2 may be any three layers out of a plurality of line layers, as long as line layers M1 to M3 are disposed in this order. Note that interlayer distance c is not limited to the distance between line layer M2 and line layer M3 in FIG. 2, and is the shortest distance between two line layers next to each other.

[2.2 Second Example of Line Layout in Line Layers]

Figure 3A:
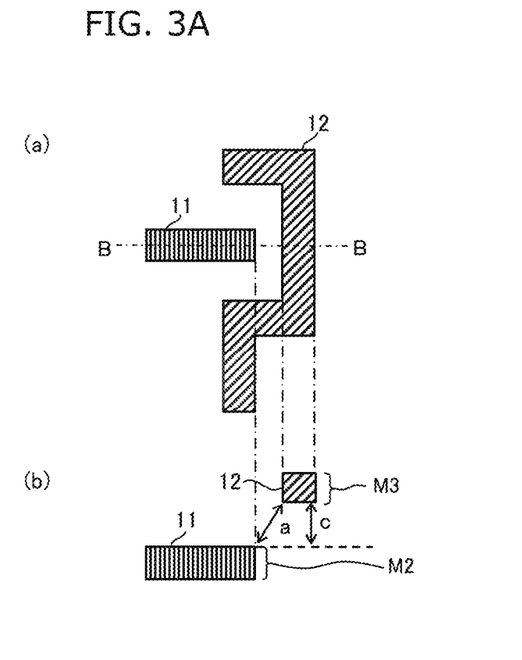
FIG. 3A illustrates a second example of a line layout in line layers.

FIG. 3A illustrates a second example of a line layout in line layers. Part (a) of FIG. 3A illustrates a line layout in a plan view of a semiconductor substrate on which latch circuit L1 is formed. Part (b) of FIG. 3A illustrates a cross section taken along line B-B in (a) of FIG. 3A, and includes two line layers M2 and M3. Part (b) of FIG. 3A is a schematically enlarged view of a portion related to a redundant line pair out of lines formed in line layers M2 and M3. FIG. 3A illustrates line 11 and line 12 that form a redundant line pair.

In a plan view illustrated in (a) of FIG. 3A, line 12 bypasses an end portion of line 11 so as not to overlap line 11.

This disposition layout readily allows the above relation (that is, a>c) to be satisfied.

According to the disposition layout in FIG. 3A, deterioration in soft error resistance caused by a short circuit of the redundant line pair can be reduced. That is because if a foreign substance having approximately the same size as interlayer distance c is mixed into, lines 11 and 12 are less likely to short-circuit. Accordingly, a short circuit of the redundant line pair can be prevented from occurring.

[2.3 Variation of Second Example of Line Layout in Line Layers]

Figure 3B:
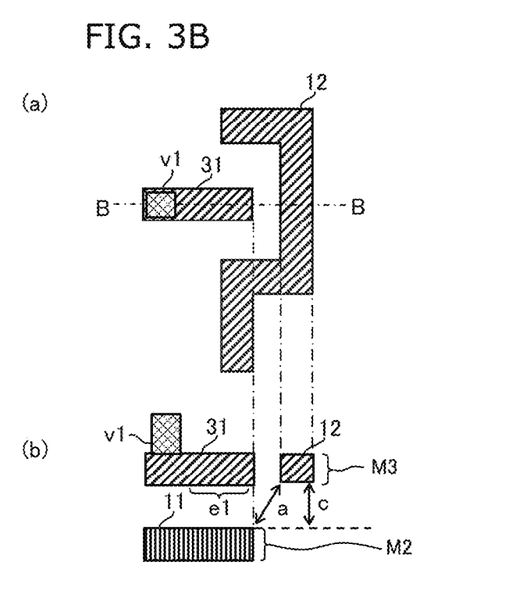
FIG. 3B illustrates a variation of the second example of the line layout in line layers.

FIG. 3B illustrates a variation of the second example of the line layout in line layers. The example in FIG. 3B is different from that in FIG. 3A in that line 31 is provided. The following gives description focusing on differences. Line 31 is disposed next to line 11 or 12, and includes via contact v1 and extending portion e1. Via contact v1 connects a line in another line layer to line 31 in line layer M3. Extending portion e1 extends from via contact v1. In addition, an extension rule as follows may be set. Specifically, the length from via v1 to an end of extending portion e1 is longer than the smallest dimension of a line specified by the design rule of the semiconductor device. Note that this extension rule may be applied to extending portions in other drawings.

In FIG. 3B, extending portion e1 of line 31 is disposed next to one line of the redundant line pair in the same line layer and next to the other line in the pair in a different line layer. Distance a is longer than the distance between line 11 and line 31 and is longer than the distance between line 12 and line 31.

Depending on a computer aided design (CAD) for line design, if the layout that does not include line 31 as shown in FIG. 3A is to be achieved, the CAD may require a limitation to use only a minimum number of lines between a redundant pair, and thus the layout may be difficult to be achieved. Disposition of a redundant line pair can be readily designed if line 31 is disposed next to line 11 or 12, as appropriate. As a result, a layout of a redundant line pair as shown in FIG. 3B can be readily achieved.

FIG. 2, FIG. 3A, and FIG. 3B each illustrate an example of disposition layout of a redundant line pair in line layers. The following describes a line layout of a redundant line pair in a single line layer.

[3.1 First Example of Line Layout in Line Layer]

Figure 4:
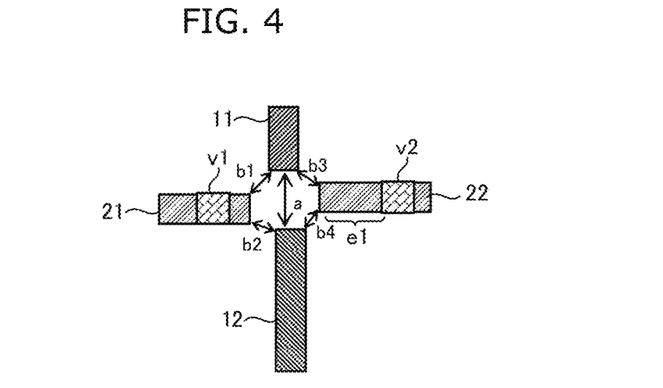
FIG. 4 illustrates a first example of a line layout in a line layer.

FIG. 4 illustrates a first example of a line layout in a line layer of the semiconductor device. FIG. 4 is a plan view of the semiconductor substrate on which latch circuit L1 in FIG. 1 is formed. Furthermore, FIG. 4 is a schematic enlarged view of some lines out of a plurality of lines formed in a single line layer. FIG. 4 illustrates a layout of four lines 11, 12, 21, and 22.

Line 11 and line 12 indicate a redundant line pair. Specifically, line 12 is not connected to line 11, and is redundantly provided to transfer a signal having the same level as the level of a signal transferred through line 11. Line 11 and line 12 correspond to line w11 and line w12 in FIG. 1, for example.

Line 21 is another line different from lines 11 and 12. Line 22 is also a line different from lines 11 and 12.

In FIG. 4, sign a denotes a distance between line 11 and line 12. Sign b1 denotes a distance between line 11 and line 21. Sign b2 denotes a distance between line 12 and line 21. Sign b3 denotes a distance between line 11 and line 22. Sign b4 denotes a distance between line 12 and line 22. Note that the distances are shortest distances between lines.

The layout of those lines satisfies the following relations.

Distance a between line 11 and line 12 is longer than distance b1 between line 11 and line 21.

Distance a between line 11 and line 12 is longer than distance b2 between line 12 and line 21.

Distance a between line 11 and line 12 is longer than distance b3 between line 11 and line 22.

Distance a between line 11 and line 12 is longer than distance b4 between line 12 and line 22.

By satisfying such relations, if a foreign substance is mixed into, line 11 or 12 and another line (21, 22) are more likely to short-circuit than a short circuit between lines 11 and 12 that form a redundant line pair. As a result, an undetectable short circuit can be prevented from occurring, or stated differently, a redundant line pair can be prevented from short-circuiting.

Line 11 or 12 and another line (21, 22) are more likely to short-circuit, and thus the short circuit can be detected. Accordingly, deterioration in soft error resistance caused by a short circuit of a redundant line pair can be reduced.

In FIG. 4, line 22 includes extending portion e1 that extends from via v2 connected to a body portion of line 22. An end of extending portion e1 may be an open end that is not connected in the line layer.

Note that line 21 and line 22 in FIG. 4 may correspond to line w21 and line w22 in FIG. 1, for example. Alternatively, line 21 and line 22 may each be a power line or a ground line.

[3.2 Second Example of Line Layout in Line Layer]

Figure 5:
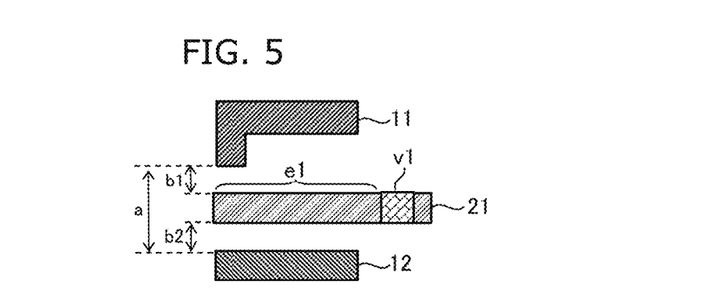
FIG. 5 illustrates a second example of a line layout in a line layer.

FIG. 5 illustrates a second example of a line layout in a line layer. FIG. 5 is a schematic enlarged view of some lines out of a plurality of lines formed in a single line layer. FIG. 5 illustrates a layout of lines 11, 12, and 21. Sign v1 in FIG. 5 denotes a via contact that connects line 21 to a line in another line layer. Sign e1 denotes an extending portion of line 21.

Line 11 and line 12 indicate a redundant line pair. Line 21 is another line different from lines 11 and 12. The line layer includes a parallel section in which lines 11 and 12 that form a redundant line pair are disposed parallel to each other, and another line 21 is located between line 11 and line 12 throughout the parallel section.

An example of the line layout in FIG. 5 satisfies the following relation similarly to FIG. 4.

Distance a between line 11 and line 12 is longer than distance b1 between line 11 and line 21.

Distance a between line 11 and line 12 is longer than distance b2 between line 12 and line 21.

In FIG. 5, line 11 and line 12 that form a redundant line pair are disposed with another line 21 being located therebetween throughout the parallel section in which lines 11 and 12 are disposed parallel to each other. Accordingly, line 21 includes extending portion e1. Thus, line 21 includes extending portion e1 that extends from via v1 connected to a body portion of line 21. Extending portion e1 is disposed between line 11 and line 12 in the parallel section. Further, an end of extending portion e1 may be an open end that is not connected in the line layer.

According to the example of the line layout in FIG. 5, if a foreign substance is mixed into, line 11 or 12 and another line 21 are more likely to short-circuit before line 11 and line 12 that form a redundant line pair short-circuit. Stated differently, a probability that a detectable short circuit occurs instead of a short circuit of a redundant line pair is high. Accordingly, deterioration in soft error resistance caused by a short circuit of a redundant line pair can be reduced.

Note that line 21 in FIG. 5 may be a line corresponding to one of lines w21 and w22 in FIG. 1, a power line, or a ground line, for example.

[3.3 Third Example of Line Layout in Line Layer]

Figure 6:
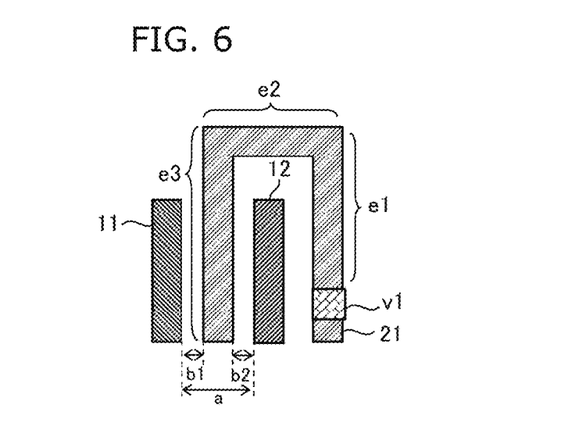
FIG. 6 illustrates a third example of a line layout in a line layer.

FIG. 6 illustrates a third example of a line layout in a line layer. FIG. 6 is a schematic enlarged view of some lines out of a plurality of lines formed in a single line layer. FIG. 6 illustrates a layout of lines 11, 12, and 21. Sign v1 in FIG. 6 denotes a via contact that connects line 21 to a line in another line layer.

Line 11 and line 12 indicate a redundant line pair. Line 21 is another line different from lines 11 and 12. The line layer includes a parallel section in which lines 11 and 12 that form a redundant line pair are disposed parallel to each other, and another line 21 is located between line 11 and line 12 throughout the parallel section.

An example of the line layout in FIG. 6 also satisfies the following relations similarly to FIG. 4.

Distance a between line 11 and line 12 is longer than distance b1 between line 11 and line 21.

Distance a between line 11 and line 12 is longer than distance b2 between line 12 and line 21.

In FIG. 6, line 11 and line 12 that form a redundant line pair are disposed with another line 21 being located therebetween throughout the parallel section in which lines 11 and 12 are disposed parallel to each other. Accordingly, line 21 includes extending portions e1 to e3. Thus, line 21 includes extending portions e1 to e3 that extend from via v1 connected to a body portion of line 21. Extending portions e1 to e3 are continuous to form a single line, and are disposed, bypassing an end portion of line 12 in the line layer. A portion of extending portion e3 is disposed so as to be located between line 11 and line 12 throughout the parallel section. Further, an end of extending portion e3 may be an open end that is not connected in the line layer. Distances b1 and b2 in FIG. 6 may each be a shortest interval between lines specified by a design rule of the semiconductor device. Distance a between line 11 and line 12 is longer than the shortest interval between lines specified by the design rule.

According to the example of the line layout in FIG. 6, if a foreign substance is mixed into, line 11 or 12 and another line 21 are more likely to short-circuit before line 11 and line 12 that form a redundant line pair short-circuit. Stated differently, a probability that a detectable short circuit occurs instead of a short circuit of a redundant line pair is high. Accordingly, deterioration in soft error resistance caused by a short circuit of a redundant line pair can be reduced.

Note that line 21 in FIG. 6 may be a line corresponding to one of lines w21 and w22 in FIG. 1, a power line, or a ground line, for example.

[3.4 Fourth Example of Line Layout in Line Layer]

Figure 7:
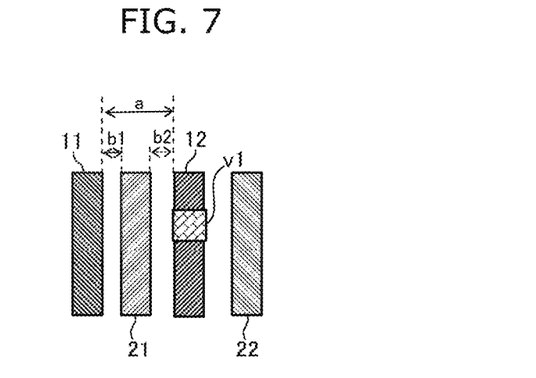
FIG. 7 illustrates a fourth example of a line layout in a line layer.

FIG. 7 illustrates a fourth example of a line layout in a line layer. FIG. 7 is a schematic enlarged view of some lines out of a plurality of lines formed in a single line layer. FIG. 7 illustrates a layout of lines 11, 12, 21, and 22. Sign v1 in FIG. 7 denotes a via contact that connects line 21 to a line in another line layer.

Line 11 and line 12 indicate a redundant line pair. Line 21 and line 22 indicate a redundant line pair. A line pair of lines 11 and 12 is referred to as a first redundant pair, and a line pair of lines 21 and 22 is referred to as a second redundant pair. In FIG. 7, four lines 11, 12, 21, and 22 are disposed such that line 11 that is one line of the first redundant pair, line 21 that is one line of the second redundant pair, line 12 that is the other line of the first redundant pair, and line 22 that is the other line of the second redundant pair are disposed in this order. Thus, the lines of the two redundant pairs are alternately disposed, and lines having the same signal level are not next to each other.

An example of the line layout in FIG. 7 also satisfies the following relations similarly to FIG. 4.

Distance a between line 11 and line 12 is longer than distance b1 between line 11 and line 21.

Distance a between line 11 and line 12 is longer than distance b2 between line 12 and line 21.

Lines 11, 12, 21, and 22 in FIG. 7 may each be a body portion or an extending portion of a line.

According to the example of the line layout in FIG. 7, if a foreign substance is mixed into, line 11 or 12 and another line 21 or 22 are more likely to short-circuit before line 11 and line 12 that form a redundant line pair short-circuit. Stated differently, a probability that a detectable short circuit occurs instead of a short circuit of a redundant line pair is high. Accordingly, deterioration in soft error resistance caused by a short circuit of a redundant line pair can be reduced.

Note that lines 11 and 12 in FIG. 7 may correspond to line w11 and line w12 in FIG. 1, and line 21 and line 22 may correspond to line w21 and line w22 in FIG. 1.

[3.5 Fifth Example of Line Layout in Line Layer]

Figure 8:
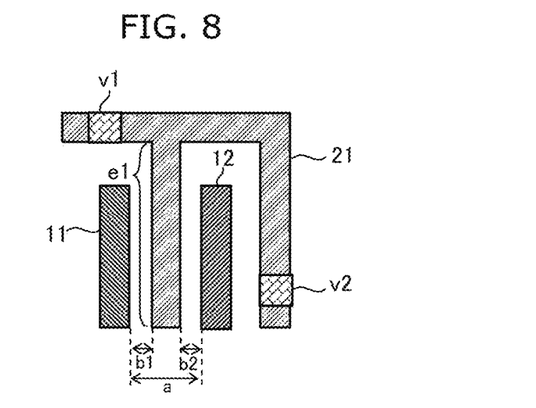
FIG. 8 illustrates a fifth example of a line layout in a line layer.

FIG. 8 illustrates a fifth example of a line layout in a line layer. FIG. 8 is a schematic enlarged view of some lines out of a plurality of lines formed in a single line layer. FIG. 8 illustrates a layout of lines 11, 12, and 21. Signs v1 and v2 in FIG. 8 each denote a via contact that connects line 21 to a line in another line layer. Sign e1 denotes an extending portion of line 21.

Line 11 and line 12 indicate a redundant line pair. Line 21 is another line different from lines 11 and 12. The line layer includes a parallel section in which lines 11 and 12 that form a redundant line pair are disposed parallel to each other, and another line 21 is located between line 11 and line 12 throughout the parallel section.

An example of the line layout in FIG. 8 satisfies the following relation similarly to FIG. 4.

Distance a between line 11 and line 12 is longer than distance b1 between line 11 and line 21.

Distance a between line 11 and line 12 is longer than distance b2 between line 12 and line 21.

In FIG. 8, line 11 and line 12 that form a redundant line pair are disposed with another line 21 being located therebetween throughout the parallel section in which lines 11 and 12 are disposed parallel to each other. Accordingly, line 21 includes extending portion e1. Thus, line 21 includes extending portion e1 that extends from a body portion of line 21. Extending portion e1 is disposed between line 11 and line 12 in the parallel section. Further, an end of extending portion e1 may be an open end that is not connected in the line layer.

According to the example of the line layout in FIG. 8, if a foreign substance is mixed into, line 11 or 12 and another line 21 are more likely to short-circuit than a short circuit between line 11 and line 12 that form a redundant line pair. Stated differently, a probability that a detectable short circuit occurs instead of a short circuit of a redundant line pair is high. Accordingly, deterioration in soft error resistance caused by a short circuit of a redundant line pair can be reduced.

Note that line 21 in FIG. 8 may be a line corresponding to one of lines w21 and w22 in FIG. 1, a power line, or a ground line, for example.

[3.6 Sixth Example of Line Layout in Line Layer]

Figure 9:
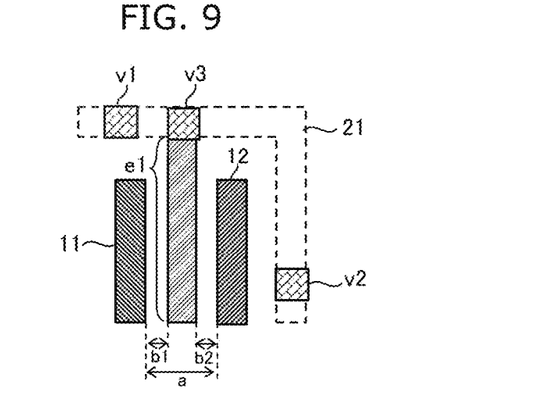
FIG. 9 illustrates a sixth example of a line layout in a line layer.

FIG. 9 illustrates a sixth example of a line layout in a line layer. The example in FIG. 9 is different from that in FIG. 8 in that the body portion of line 21 is included in another line layer and extending portion e1 extends from the body portion of line 21 through via v3. The following gives description focusing on differences.

The body portion of line 21 is included in another line layer different from the line layer that includes line 11 and line 12, as indicated by the broken lines in FIG. 9.

Extending portion e1 extends from the body portion of line 21 included in the other line layer through via v3. Accordingly, the line layer includes a parallel section in which lines 11 and 12 that form a redundant line pair are disposed parallel to each other, and extending portion e1 of another line 21 is located between line 11 and line 12 throughout the parallel section.

According to the example of the line layout in FIG. 9, deterioration in soft error resistance caused by a short circuit of the redundant line pair can be reduced, similarly to FIG. 8.

[3.7 Seventh Example of Line Layout in Line Layer]

Figure 10:
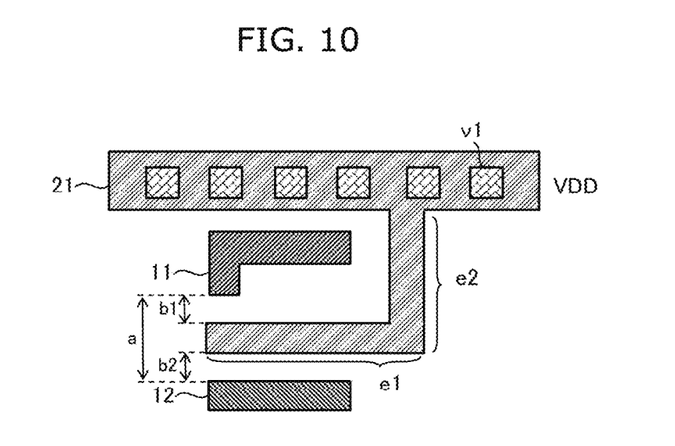
FIG. 10 illustrates a seventh example of a line layout in a line layer.

FIG. 10 illustrates a seventh example of a line layout in a line layer. The example in FIG. 10 is different from that in FIG. 5 in that a power line is additionally provided. The following gives description focusing on differences.

Line 21 is a power line, and includes extending portions e1 and e2 that extend from the body portion of the power line. The power line may be a line that surrounds the entirety or a portion of latch circuit L1 in the line layer or a shield line formed in another line layer, for example.

According to the example of the line layout in FIG. 10, deterioration in soft error resistance caused by a short circuit of the redundant line pair can be reduced, similarly to FIG. 5.

[3.8 Eighth Example of Line Layout in Line Layer]

Figure 11:
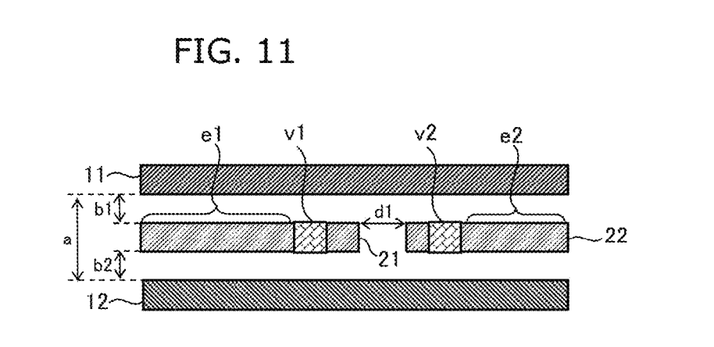
FIG. 11 illustrates an eighth example of a line layout in a line layer.

FIG. 11 illustrates an eighth example of a line layout in a line layer. FIG. 11 is a schematic enlarged view of some lines out of a plurality of lines formed in a single line layer. FIG. 11 illustrates a layout of lines 11, 12, 21, and 22. Sign v1 in FIG. 11 denotes a via contact that connects line 21 to a line in another line layer. Sign v2 denotes a via contact that connects line 22 to a line in another line layer. Sign e1 denotes an extending portion of line 21. Sign e2 denotes an extending portion of line 22.

Line 11 and line 12 indicate a redundant line pair. Line 21 is another line different from lines 11 and 12. Line 22 is another line different from lines 11 and 12. Line 21 and line 22 do not form a redundant line pair. The line layer includes a parallel section in which lines 11 and 12 that form a redundant line pair are disposed parallel to each other, and another line 21 and different another line 22 are located between line 11 and line 12 throughout most of the parallel section. Another line 21 and different another line 22 are disposed on the same straight line with space (distance dl) being provided therebetween.

An example of the line layout in FIG. 11 satisfies the following relation similarly to FIG. 4.

Distance a between line 11 and line 12 is longer than distance b1 from line 11 to lines 21 and 22.

Distance a between line 11 and line 12 is longer than distance b2 from line 12 to lines 21 and 22.

Furthermore, in FIG. 11, distance a between line 11 and line 12 is longer than distance dl between line 21 and line 22. Stated differently, distance dl of a section in which line 11 and line 12 are next and parallel to each other (that is, a section in which the lines do not have another line located therebetween) is shorter than distance a between line 11 and line 12. Further stated differently, the line layer includes a section in which line 11 and line 12 are disposed parallel to each other with line 21 and line 22 being located therebetween. In the section, distance dl between line 21 and line 22 is shorter than distance a between line 11 and line 12.

In FIG. 11, line 11 and line 12 that form a redundant line pair are disposed with line 21 and line 22 being located therebetween throughout most of the parallel section in which lines 11 and 12 are disposed parallel to each other. Accordingly, line 21 includes extending portion e1, and line 22 includes extending portion e2. Thus, ends of extending portions e1 and e2 may be open ends that are not connected in the line layer.

According to the example of the line layout in FIG. 11, deterioration in soft error resistance caused by a short circuit of the redundant line pair can be reduced, similarly to FIG. 5.

Note that line 21 in FIG. 11 may be a power line or a ground line, for example. Line 22 may be a power line or a ground line, for example.

[4 Another Example of Circuit of Semiconductor Device]

Next, another example of a circuit that includes a redundant line pair is to be described.

Figure 12:
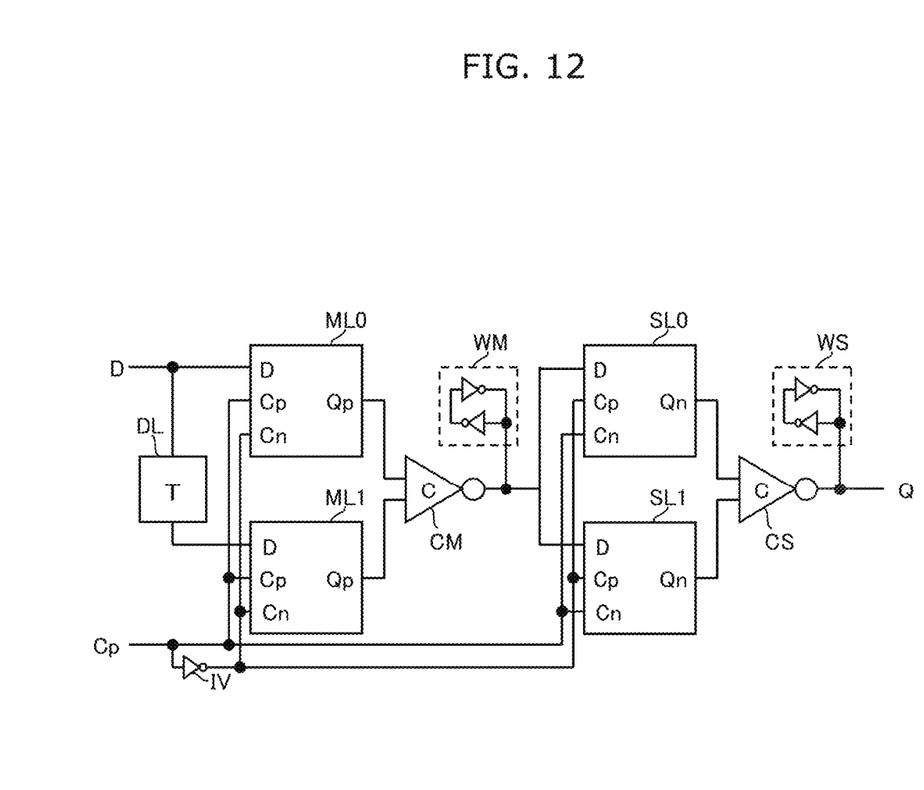
FIG. 12 illustrates another example of a circuit formed in a semiconductor device according to Embodiment 1.

FIG. 12 illustrates another example of a circuit formed in a semiconductor device according to Embodiment 1. In the semiconductor device in FIG. 12, an example of a configuration of a built-in soft error resilience (BISER) flip-flop circuit is shown as a circuit provided with soft error resistance.

The flip-flop circuit in FIG. 12 includes delay circuit DL, inverter IV, master latches ML0 and ML1, master C-element CM, slave latches SL0 and SL1, slave C-element CS, master weak keeper circuit WM, and slave weak keeper circuit WS, which form a dual master-slave structure. The redundant line pair in FIG. 12 include a line connected to output Qn of slave latch SL0, and a line connected to output Qn of slave latch SL1.

Delay circuit DL delays input data D that is input to master latch ML0 by time T, and outputs resultant data to master latch ML1.

Inverter IV outputs clock signal Cn resulting from inverting clock signal Cp.

Master latch ML0 latches input data D in synchronization with clock signal Cp and clock signal Cn, and outputs data Qp. Output data Qp is non-inverted output data having the same logic level as that of data D.

Master latch ML1 latches delayed input data D in synchronization with clock signal Cp and clock signal Cn, and outputs data Qp. Output data Qp is non-inverted output data having the same logic level as that of data D.

Master C-element CM is a two-input one-output inverting circuit. If two inputs have the determined same logic level, master C-element CM outputs a signal having a level that is the inverted determined logic level, and if the two inputs do not have the determined same logic level, the output thereof is placed in the high impedance state.

Master weak keeper circuit WM is a weak keeper circuit, holds a logic level of a signal output by master C-element CM, and if the output of master C-element CM is in the high impedance state, outputs a signal having a logic level held immediately before the output is placed in the high impedance state.

Slave latch SL0 latches input data D in synchronization with clock signal Cp and clock signal Cn, and outputs data Qn. Output data Qn is data having a logic level that is an inverted logic level of data D.

Slave latch SL1 latches input data D in synchronization with clock signal Cp and clock signal Cn, and outputs data Qn. Output data Qn is data having a logic level that is an inverted logic level of data D.

Figure 13:
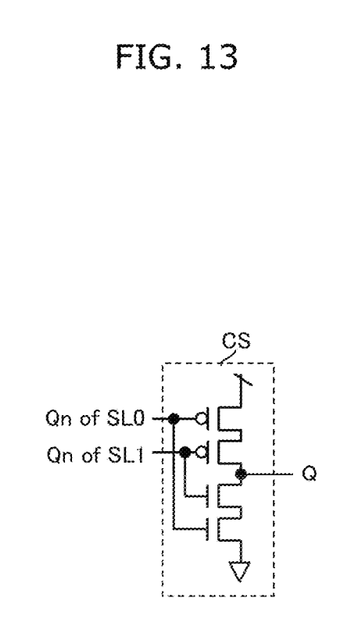
FIG. 13 illustrates an example of a C-element in FIG. 12.

Slave C-element CS is a two-input one-output inverting circuit. If two inputs have the determined same logic level, slave C-element CS outputs a signal having a logic level that is the inverted determined logic level, and if the two inputs do not have the determined same logic level, the output thereof is placed in the high impedance state. FIG. 13 illustrates an example of a circuit of slave C-element CS. Slave C-element CS in FIG. 13 includes two PMOS transistors and two NMOS transistors. The two PMOS transistors and the two NMOS transistors are connected in series. Note that master C-element CM may include a circuit the same as the circuit illustrated in FIG. 13.

Slave weak keeper circuit WS is a weak keeper circuit, holds a logic level the same as that of a signal output by slave C-element CS, and if the output of slave C-element CS is in the high impedance state, outputs a signal having a logic level held immediately before the output is placed in the high impedance state.

In such a flip-flop circuit, if the output of one of the two sets of the master-slave latches is inverted by a soft error, the output of master C-element CM or slave C-element CS is placed in the high impedance state, but nevertheless correct data can be maintained owing to a logic level held by master weak keeper circuit WM or slave weak keeper circuit WS.

The redundant line pair in the flip-flop circuit in FIG. 12 include a line that connects the output terminal of slave latch SL0 to one of the two input terminals of slave C-element CS, and a line that connects the output terminal of slave latch SL1 to the other of the two input terminals of slave C-element CS. Stated differently, the output line of slave latch SL0 and the output line of slave latch SL1 form a redundant line pair.

The line pair satisfy the relation of the disposition layout described with reference to FIG. 2 to FIG. 11. Accordingly, deterioration in soft error resistance caused by a short circuit of the redundant line pair in the flip-flop circuit in FIG. 12 can be reduced.

Note that the output line of master latch ML0 and the output line of master latch ML1 in FIG. 12 may be treated the same as a redundant line pair. Thus, the output lines may satisfy the relation of the disposition layout described with reference to FIG. 2 to FIG. 11.

Input data D of master latch ML1 is delayed by time T relative to input data D of master latch ML0. Accordingly, output data Qp of master latch ML1 is delayed by time T relative to output data Qp of master latch ML0. In this Specification, a "redundant line pair" is defined as "independent lines that have the same signal level, but are not connected to each other". The output line of master latch ML0 and the output line of master latch ML1 do not satisfy this definition. Yet, the output line of master latch ML0 and the output line of master latch ML1 may have problems of the short circuits of lines as illustrated in FIG. 14, and substantially fall within the definition of "redundant line pair" except for delay time T. According to this, the output line of master latch ML0 and the output line of master latch ML1 can reduce deterioration in soft error resistance by satisfying the relation of the disposition layout described with reference to FIG. 2 to FIG. 11.

Note that in the embodiment, as a redundant line pair, an example in which dual redundant pairs are included, yet two line combinations out of triple or more redundant line pairs may each be regarded as a redundant line pair. In this case, two lines considered to form a redundant line pair may satisfy the relation of the disposition layout described with reference to FIG. 2 to FIG. 11.

As described above, a semiconductor device according to an embodiment includes: a plurality of line layers; first line 11; and second line 12 that is not connected to first line 11 and is disposed to transfer a signal having a level same as a level of a signal transferred through first line 11. First line 11 and second line 12 are included in different line layers, and distance a1 between first line 11 and second line 12 is longer than interlayer distance c between line layers next to each other.

According to this, deterioration in soft error resistance caused by a short circuit of a redundant line pair can be reduced. That is because if a foreign substance having approximately the same size as the distance between lines is mixed into, the first line and the second line are less likely to short-circuit. Stated differently, a short circuit of a redundant line pair can be prevented from occurring.

Here, in a plan view of the semiconductor device, the semiconductor device may have an overlapping portion in which first line 11 and second line 12 overlap each other, and a distance between first line 11 and second line 12 in the overlapping portion may be at least twice interlayer distance c.

Here, in the plan view of the semiconductor device, first line 11 and second line 12 may cross each other in the overlapping portion, second line 12 may include first partial line 12b in which the overlapping portion is included, second partial line 12a connected to a first end of first partial line 12b, and third partial line 12c connected to a second end of first partial line 12b, first partial line 12b may be included in first line layer M1, second partial line 12a and third partial line 12c may be included in second line layer M2 different from first line layer M1, and may be connected to first partial line 12b through via contacts v1 and v2, respectively, and first line 11 may be included in third line layer M3 farther from first line layer M1 than from second line layer M2.

Here, in a plan view of the semiconductor device, second line 12 may bypass an end portion of first line 11 to prevent first line 11 and second line 12 from overlapping.

Here, the semiconductor device may further include third line 31 opposed to at least one of first line 11 or second line 12, third line 31 and the at least one of first line 11 or second line 12 being included in one of or different ones of the plurality of line layers. Third line 31 may include extending portion e1 that extends from via contact v1.

Here, a length of extending portion e1 may be greater than a smallest dimension specified by a design rule of the semiconductor device.

Here, first line 11 and second line 12 may be included in a dual interlocked storage cell (DICE) latch circuit.

Here, first line 11 and second line 12 may be included in a built-in soft error resiliency (BISER) flip-flop circuit.

A semiconductor device according to an embodiment includes: first line 11; second line 12 that is not connected to first line 11 and is provided to transfer a signal having a level same as a level of a signal transferred through first line 11; and another line different from first line 11 and second line 12. In a line layer, distance a between first line 11 and second line 12 is longer than a distance between first line 11 and the other line, and is longer than a distance between second line 12 and the other line.

According to this, deterioration in soft error resistance caused by a short circuit of a redundant line pair can be reduced. That is because if a foreign substance having approximately the same size as a distance between lines is mixed into, a short circuit between the other line and the first line or the second line is more likely to occur than a short circuit between the first line and the second line. As a result, an undetectable short circuit can be prevented from occurring, or stated differently, a redundant line pair can be prevented from short-circuiting.

Here, the line layer may include a parallel section in which first line 11 and second line 12 are disposed parallel to each other, and the other line may be located between first line 11 and second line 12 in the parallel section.

Here, in the line layer, the other line may include extending portion e1 that extends from a body portion of the other line, and extending portion e1 may be located between first line 11 and second line 12 in the parallel section in the line layer.

Here, the other line may include extending portion e1 that extends from a via connected to a body portion of the other line, and extending portion e1 may be located between first line 11 and second line 12 in the parallel section in the line layer.

Here, in the line layer, the other line may include extending portion e1 that branches and extends from a body portion of the other line, and extending portion e1 may be located between first line 11 and second line 12 in the parallel section in the line layer.

Here, an end of extending portion e1 may be an open end that is not connected in the line layer.

Here, extending portions e1 to e3 may each bypass an end portion of one of first line 11 and second line 12 in the line layer, and may each be disposed in the parallel section.

Here, the semiconductor device may further include: a third line; and a fourth line that is not connected to first line 11 and is provided to transfer a signal having a level same as a level of a signal transferred through the third line, and the other line may be the third line.

Here, a portion of first line 11, a portion of the third line, a portion of second line 12, and a portion of the fourth line may be disposed in stated order in the line layer.

According to this, one line of a first redundant pair, one line of a second redundant pair, the other line of the first redundant pair, and the other line of the second redundant pair are disposed in this order, and thus short circuits of the redundant pairs can be prevented or can be made less likely to occur.

Here, the via may connect the extending portion to the body portion of another line 21/22, the body portion being included in another line layer different from the line layer.

Here, a length of the extending portion may be greater than a smallest dimension specified by a design rule of the semiconductor device.

Here, the line layer may include a section in which first line 11 and second line 12 are disposed parallel to each other with another line 21/22 and a different another line being located therebetween, the different another line being different from first line 11, second line 12, and another line 21/22, and in the section, distance dl between another line 21/22 and the different another line may be shorter than a distance between first line 11 and second line 12.

The above has described a semiconductor device according to one or more aspects, based on embodiments, yet the present disclosure is not limited to such embodiments. The scope of the one or more aspects may encompass embodiments as a result of making, to the embodiments of the present disclosure, various modifications that may be conceived by those skilled in the art and combining elements in different embodiments, as long as the resultant embodiments do not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a semiconductor device that includes a latch circuit or a flip-flop circuit.

The invention claimed is:

1. A semiconductor device comprising:
    a plurality of line layers;
    a first line; and
    a second line that is not connected to the first line and is provided to transfer a signal having a level same as a level of a signal transferred through the first line,
    wherein the first line and the second line are included in different layers out of the plurality of line layers, and
    a distance between the first line and the second line is longer than an interlayer distance between line layers next to each other out of the plurality of line layers and
    the first line and the second line are included in a dual interlocked storage cell (DICE) latch circuit.

2. The semiconductor device according to claim 1,
    wherein in a plan view of the semiconductor device, the semiconductor device includes an overlapping portion in which the first line and the second line overlap each other, and
    a distance between the first line and the second line in the overlapping portion is at least twice the interlayer distance.

3. The semiconductor device according to claim 2,
    wherein in the plan view of the semiconductor device, the first line and the second line cross each other in the overlapping portion,
    the second line includes:
        a first partial line in which the overlapping portion is included;
        a second partial line connected to a first end of the first partial line; and
        a third partial line connected to a second end of the first partial line,
    the first partial line is included in a first line layer,
    the second partial line and the third partial line are included in a second line layer different from the first line layer, and are each connected to the first partial line through a via contact, and
    the first line is included in a third line layer farther from the first line layer than from the second line layer.

4. The semiconductor device according to claim 1,
    wherein in a plan view of the semiconductor device, the second line bypasses an end portion of the first line to prevent the first line and the second line from overlapping each other.

5. The semiconductor device according to claim 1, further comprising:
    a third line opposed to at least one of the first line or the second line, the third line and the at least one of the first line or the second line being included in one of or different ones of the plurality of line layers,
    wherein the third line includes an extending portion that extends from a via contact.

6. The semiconductor device according to claim 5,
    wherein a length of the extending portion is greater than a smallest dimension specified by a design rule of the semiconductor device.

7. A semiconductor device comprising:
    a plurality of line layers;

a first line; and a second line that is not connected to the first line and is provided to transfer a signal having a level same as a level of a signal transferred through the first line, wherein:

the first line and the second line are included in different layers out of the plurality of line layers, and a distance between the first line and the second line is longer than an interlayer distance between line layers next to each other out of the plurality of line layers, and wherein the first line and the second line are included in a built-in soft error resiliency (BISER) flip-flop circuit.

8. The semiconductor device according to claim 7, wherein in a plan view of the semiconductor device, the semiconductor device includes an overlapping portion in which the first line and the second line overlap each other, and a distance between the first line and the second line in the overlapping portion is at least twice the interlayer distance.

9. The semiconductor device according to claim 8, wherein in the plan view of the semiconductor device, the first line and the second line cross each other in the overlapping portion, the second line includes:

a first partial line in which the overlapping portion is included;

a second partial line connected to a first end of the first partial line; and a third partial line connected to a second end of the first partial line, the first partial line is included in a first line layer, the second partial line and the third partial line are included in a second line layer different from the first line layer, and are each connected to the first partial line through a via contact, and the first line is included in a third line layer farther from the first line layer than from the second line layer.

10. The semiconductor device according to claim 7, wherein in a plan view of the semiconductor device, the second line bypasses an end portion of the first line to prevent the first line and the second line from overlapping each other.

11. The semiconductor device according to claim 7, further comprising:

a third line opposed to at least one of the first line or the second line, the third line and the at least one of the first line or the second line being included in one of or different ones of the plurality of line layers, wherein the third line includes an extending portion that extends from a via contact.

12. The semiconductor device according to claim 11, wherein a length of the extending portion is greater than a smallest dimension specified by a design rule of the semiconductor device.

\* \* \* \* \*